(12) United States Patent
Brown et al.

(10) Patent No.: US 6,267,549 B1
(45) Date of Patent: *Jul. 31, 2001

(54) DUAL INDEPENDENT ROBOT BLADES WITH MINIMAL OFFSET

(75) Inventors: William Brown, San Jose; Michael Welch, Livermore, both of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/088,965

(22) Filed: Jun. 2, 1998

(51) Int. Cl.[7] .................................................. B25J 18/04
(52) U.S. Cl. .......................................... 414/744.5; 901/15
(58) Field of Search ............................ 414/744.1, 744.5, 414/744.6, 749; 901/8, 15

(56) References Cited

U.S. PATENT DOCUMENTS

| | | | |
|---|---|---|---|
| 4,746,256 | 5/1988 | Boyle et al. | 414/217 |
| 4,819,167 | 4/1989 | Cheng et al. | 364/167.01 |
| 4,909,701 | * 3/1990 | Hardegen et al. | 414/749 |
| 5,020,475 | 6/1991 | Crabb et al. | 118/719 |
| 5,100,502 | * 3/1992 | Murdoch et al. | 414/744.1 |
| 5,151,008 | * 9/1992 | Ishida et al. | 901/15 X |
| 5,280,983 | 1/1994 | Maydan et al. | 294/119.1 |
| 5,292,393 | 3/1994 | Maydan et al. | 156/345 |
| 5,435,682 | 7/1995 | Crabb et al. | 414/217 |
| 5,452,521 | 9/1995 | Niewmierzycki | 33/520 |
| 5,569,014 | 10/1996 | Hofmeister | 414/744.3 |
| 5,636,963 | * 6/1997 | Haraguchi et al. | 414/217 X |
| 5,655,060 | 8/1997 | Lucas | 395/85 |
| 5,702,228 | * 12/1997 | Tamai et al. | 414/744.5 |
| 6,099,238 | * 8/2000 | Tsubota | 414/744.5 |

FOREIGN PATENT DOCUMENTS 4-87785 * 3/1992 (JP).

* cited by examiner

Primary Examiner—F. J. Bartuska
(74) Attorney, Agent, or Firm—Townsend Townsend and Crew

(57) ABSTRACT

A wafer handling robot system (10) operates in a wafer chamber (40) and comprises two independent robot blades, an upper blade (18) surmounting a lower blade (26). A pair of wafers (28, 32) are supported and positioned at the outer ends (78) of the upper and lower blades (18, 26). The upper robot blade (18) keeps an upper wafer (28) at a level just above the level at which the lower robot blade (26) keeps a lower wafer (32). Because the wafers are virtually at the same level, the same wafer lift mechanism can be used in the wafer chamber to lift and remove or replace the wafers on the two blades. By offsetting the height of the wafers by minimal amounts, the throughput of the system can be increased by up to a factor of two over a single robot blade system, particularly if the robot is the limiting factor on throughput. This throughput enhancement represents a substantial gain with a relatively simple and inexpensive addition to the equipment.

11 Claims, 5 Drawing Sheets

DUAL INDEPENDENT ROBOT BLADES WITH MINIMAL OFFSET

BACKGROUND OF THE INVENTION

In semiconductor manufacturing, robots are commonly used to move wafers from one location to another. The use of efficient robots is particularly important for manufacturing processes in which the wafers are subjected to many chemical processes. Because the different processes are carried out in separate reaction chambers, the wafers have to be transported from one reaction chamber to another in a multiple chamber system. U.S. Pat. No. 5,292,393 to Maydan et al. discloses an example of an integrated modular multiple chamber vacuum processing system. A robot employs a dual four-bar link mechanism for imparting selected R-theta movement to the blade to load and unload wafers in the system of Maydan et al. Other robots of a four-bar link configuration are found in U.S. Pat. No. 5,280,983 to Maydan et al. and U.S. Pat. No. 5,452,521 to Niewmierzycki.

Another type of robot arm mechanism is known as the frog-leg type mechanism. U.S. Pat. No. 5,655,060 to Lucas discloses a cluster tool robot that employs a frog-leg type dual arm mechanism driven by a drive system to rotate and to stretch or translate in and out of process modules. U.S. Pat. Nos. 5,435,682 and 5,020,475 to Crabb et al., disclose substrate handling subsystems employing frog-leg mechanisms for moving wafers or substrates to and from processing subsystems. A frog-leg robot having walking-beams is disclosed in U.S. Pat. No. 5,569,014 to Hofmeister.

The robot speed is one key factor that limits the production capability or throughput of the equipment, especially in processes that require quick and frequent transport between chambers. To achieve higher throughput, a pair of four-bar link arms have been used to operate a pair of robot blades that are stacked together and spaced from one another. The two robot arms rotate together, but may move in and out independently. After the robot rotates the arms to a chamber and aligns the upper arm with the chamber inlet, the upper arm moves into the chamber to load or unload a wafer. The upper arm is then withdrawn from the chamber, and the robot moves the arms vertically upwardly to align the lower arm with the chamber inlet. The lower robot arm then moves in and out of the chamber to load or unload a wafer. The use of the dual robot arm mechanism essentially increases the overall speed of the robot. While the use of the dual arms increases throughput, the requirement for vertical movement of the robot arms decreases the overall speed and may be undesirable in certain systems.

SUMMARY OF THE INVENTION

The present invention provides a simple and effective wafer handling robot mechanism that operates in a wafer chamber and comprises two independent robot blades for handling wafers, an upper blade surmounting a lower blade, at virtually the same level. Because the two blades are at virtually the same level, they can independently access different wafer chambers or simultaneously access the same chamber without requiring any vertical indexing. As a result, the same wafer lift mechanism can be used in the wafer chamber to lift and remove or replace the wafers on the two blades. Because no vertical indexing is required for the two blades, the present robot system is more efficient and versatile, and can improve throughput by up to about 100% over existing single blade systems.

In accordance with an aspect of the present invention, a robot blade system for moving substrates into and out of a chamber through an opening comprises a first robot blade for supporting a first substrate. A second robot blade is disposed generally above and spaced from the first robot blade by a small distance for supporting a second substrate. A first robot arm is coupled to the first robot blade for moving the first substrate and at least a portion of the first robot blade through the opening into the chamber and moving the first substrate and the first robot blade out of the chamber. A second robot arm is coupled to the second robot blade for moving the second substrate and at least a portion of the second robot blade through the opening into the chamber and moving the second substrate and the second robot blade out of the chamber. The second robot arm is independently movable from the first robot arm. This structure allows the first and second robot arms to move independently the first and second substrates, respectively, on the first and second robot blades into and out of the chamber. Because the second robot blade is spaced from the first robot blade by a small distance, the two robot blades are at virtually the same level and can access the same chamber without requiring any vertical indexing.

In addition, the robot blades can be tapered and include hollow portions to reduce the weight of the blades, thereby minimizing deflection and vibration of the blades, especially if they are long. The blades are advantageously made of a material having a strength-to-weight ratio that provides a bending deflection of the blades of under about 0.5 mm. In one example, the robot blades are up to about 300 mm in length and comprise sapphire.

Another aspect of the invention is a system for moving substrates into a housing through an opening which defines a plane spaced between an upper boundary and a lower boundary, where the plane is spaced from the lower boundary by a lower gap and spaced from the upper boundary by an upper gap. The system comprises a lower blade for supporting a lower substrate and an upper blade closely spaced from the lower blade for supporting an upper substrate. The system comprises first member, coupled to the lower blade, for moving the lower substrate through the lower gap into and out of the housing. The system further comprises second member, coupled to the upper blade and independent from the first member, for moving the upper substrate through the upper gap into and out of the housing. Because of the positions and spacings of the upper and lower blades, they can move simultaneously or separately into and out of the opening smoothly without interference.

BRIEF DESCRIPTION OF THE DRAWINGS

The preferred embodiments of this invention, illustrating all their features, will now be discussed in detail. These embodiments depict the novel and nonobvious robot system of this invention shown in the accompanying drawings, which are included for illustrative purposes only, and are not drawn to scale. These drawings include the following figures, with like numerals indicating like parts.

DETAILED DESCRIPTION OF THE INVENTION

Wafer Handling Dual Independent Robot Blades

Figure 1:
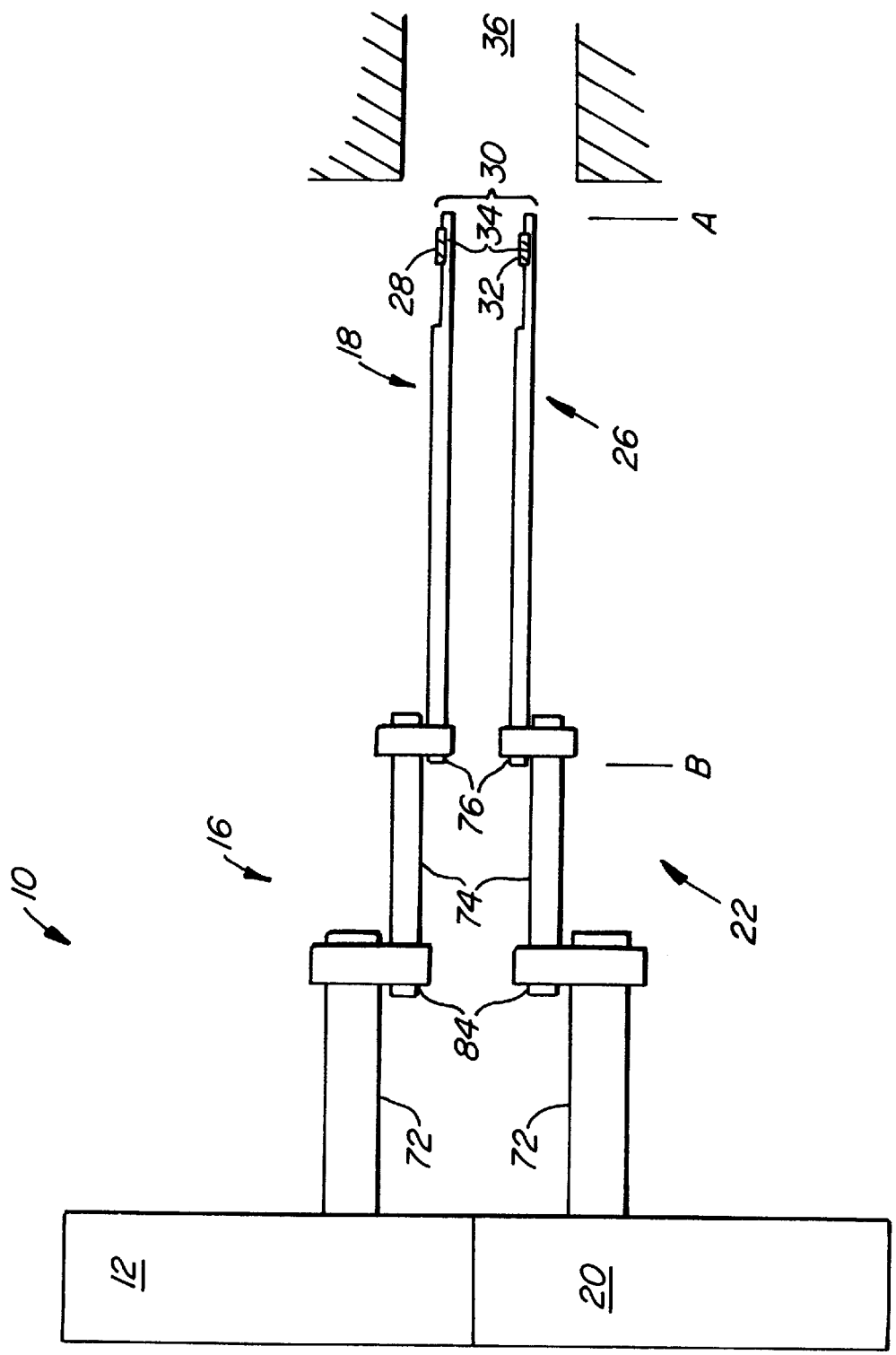
FIG. 1 is an elevational view of a wafer handling robot system with dual independent robot blades schematically illustrating an embodiment of the invention.
Figure 2:
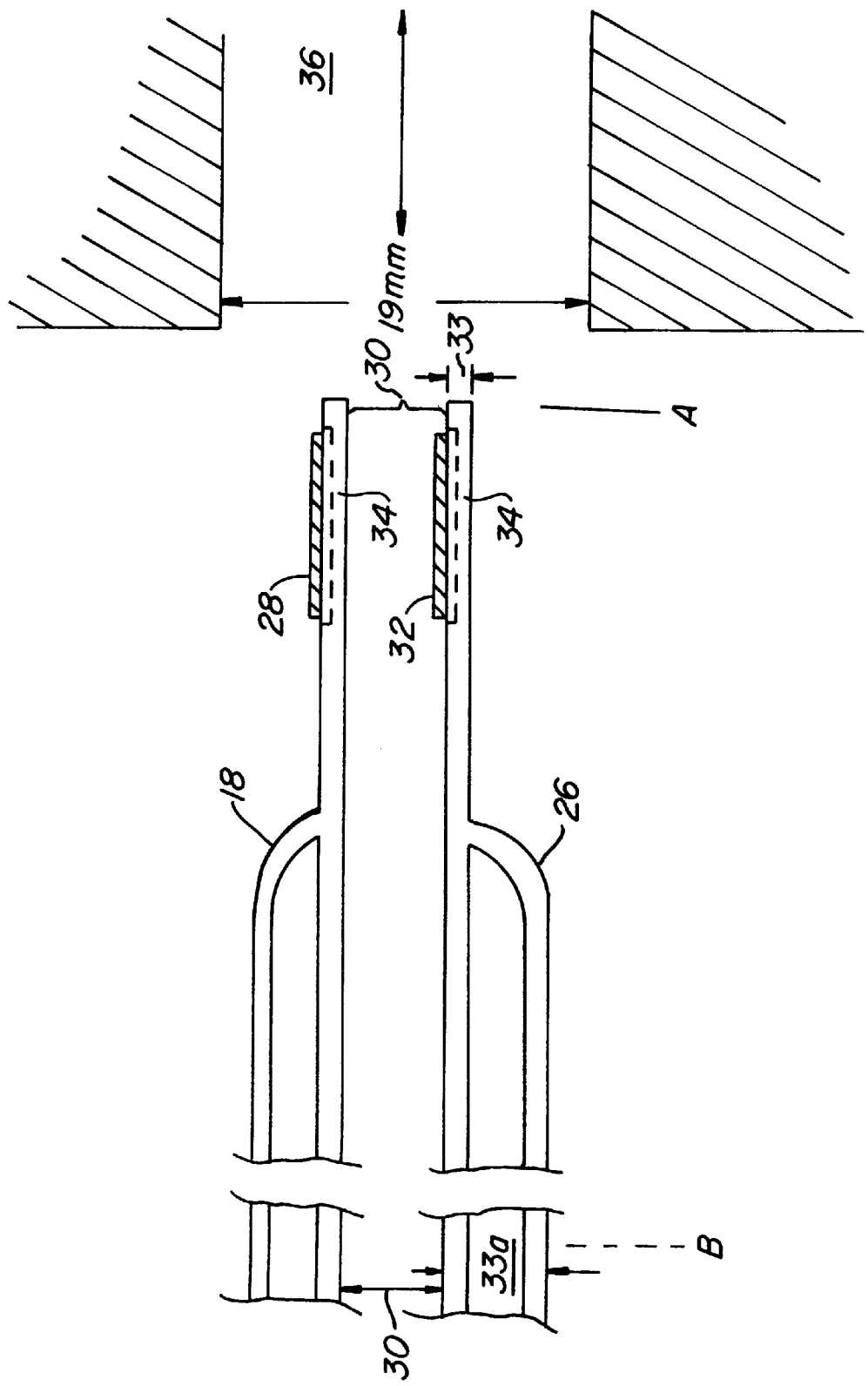
FIG. 2 is an enlarged elevational view of the ends of the dual robot blades in the robot handling system of FIG. 1 schematically illustrating the wafers disposed near the blade tips.
Figure 3:
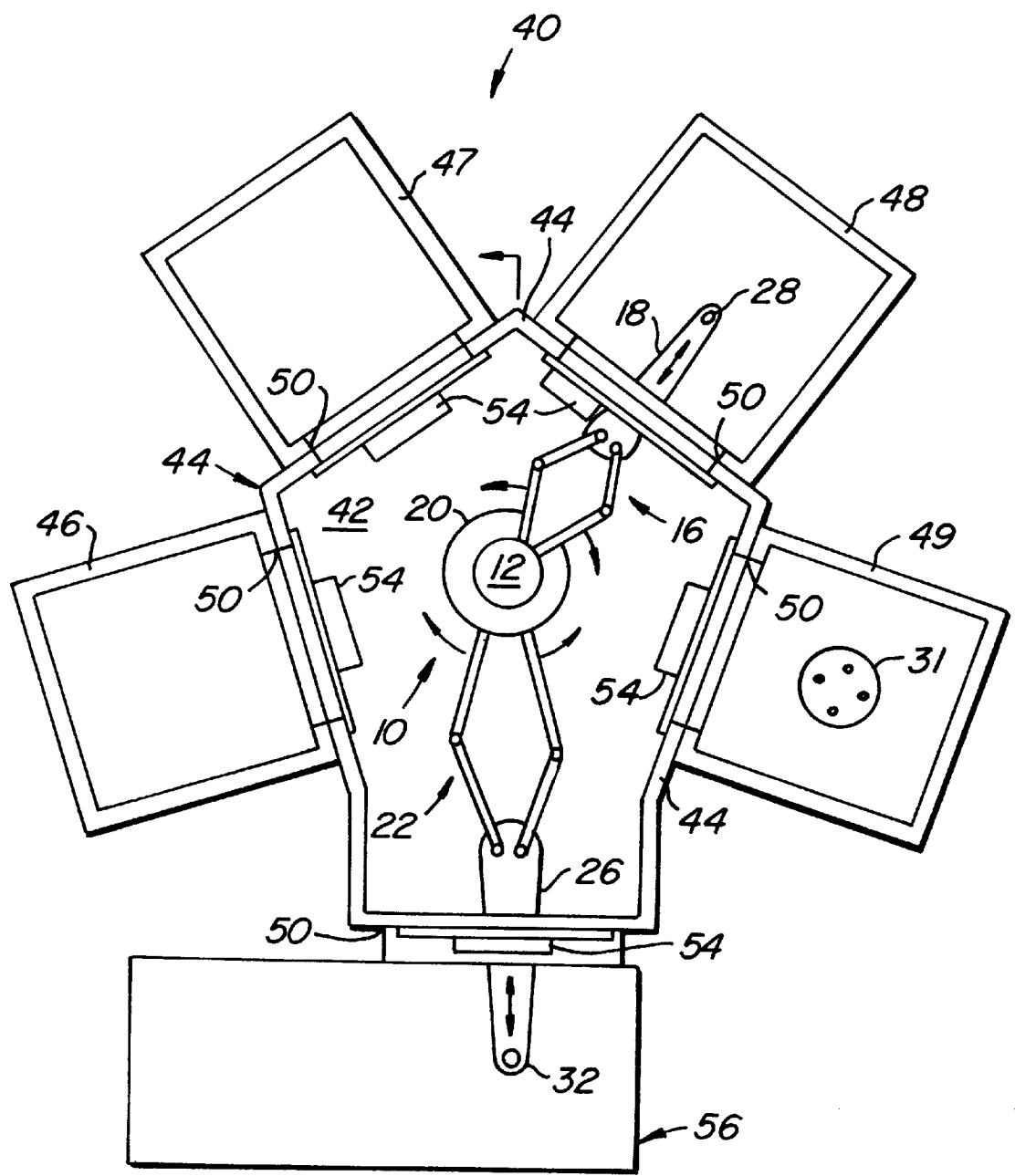
FIG. 3 is a top plan view of the wafer handling robot system of FIG. 1 in a multiple chamber integrated process system schematically illustrated to show the operating environment of the robot system.

FIGS. 1–3 show, in schematic form, a wafer or substrate handling robot mechanism or system 10 that includes a first robot 12 controlling a first robot arm 16 coupled to a first robot blade 18, and a second robot 20 controlling a second robot arm 22 coupled to a second robot blade 26. The first robot blade 18 supports a first wafer or substrate 28, and is disposed above and vertically spaced from the second robot blade 26 by a small gap 30. The second robot blade 26 supports a second wafer or substrate 32. The first and second blades 18, 26 desirably include indented seats or pockets 34 at the ends to support respectively the first and second wafers 28, 32 as best seen in FIG. 2. The robot system 10 employs a dual independent robot mechanism in that the two robot blades 18, 26 are independent, as discussed in more detail below.

FIGS. 1 and 2 show a chamber opening 36 through which wafers are transported by the robot system 10. The opening 36 typically has a height of about ¾ inch or 19 mm. The wafers 28, 32 each have a thickness of about 0.675 mm. To allow both robot blades 18, 26 to move the wafers 28, 32 smoothly through the chamber opening 36, the maximum thickness of the robot blades 18, 26 are desirably equal to or less than about 6 mm each and the gap 30 between them is desirably less than 5.0 mm, more desirably about 2.5 mm. In the embodiment shown, the robot blades 18, 26 tapers in height respectively from the robot arms 16, 22 to thinner ends. As best seen in FIG. 3, the robot blades 18, 26 desirably also taper in width respectively from the robot arms 16, 22 to the narrower ends.

Advantageously, the two sets of robot arms 16, 22 and blades 18, 26 can independently access several different chambers or the same chamber simultaneously without requiring any vertical movement. To do so, we designed robot arms 16, 22 so that both sets of arms 16, 22 and blades 18, 26 can simultaneously go into the same slit valve opening 36 (although it is possible for each set to access different chambers). Because no vertical indexing is required, the present robot system 10 is more efficient and versatile.

FIG. 2 shows the details at the ends or tips of one example of the robot blades 18, 26 with the wafers 28, 32. The blade height or thickness 33 is under about 1.05 mm at position A adjacent the tips where the wafers 28, 32 are disposed. The blade thickness 33a increases gradually to about 6 mm at position B away from the blade tips, where the blades 18, 26 desirably are hollow as shown. This tapering thickness is not shown in the figures. The gap 30 is about 2.5 mm. The blade width is about 50 mm at position A near the blade tips, and increases to about 60 mm at position B away from the blade tips (see FIG. 4). The length of the blades 18, 26 may range up to about 200 to 300 mm. The tapering of the blades 18, 26 and the use of hollow portions reduce the weight, thereby minimizing deflection and vibration of the blades 18, 26.

Other dimensions and shapes are possible depending on the operating environments. In addition, the robot blades 18, 26 are disposed near the center of the chamber opening 36. In this manner, the two robot blades 18, 26 may move smoothly in and out of the chamber simultaneously or one after the other. The spacing 30 between the blades 18, 26 is such that no adjustment in the chamber height is required to allow the wafers 28, 32 to be properly placed in the wafer chamber by the robots 12, 20. Because of the small gap 30 separating the two vertically offset blades 18, 26, the wafers 28, 32, the same wafer lift mechanism (see, e.g., 31 schematically shown in one of the chambers in FIG. 3 for illustrative purposes) can be used in the wafer chamber to lift and remove or replace the wafers 28, 32 on the two blades 18, 26, thereby increasing the throughput of the system.

In addition to being independent in translational movement in and out of the chamber, the two robot blades 18, 26 are independently moved by the two robots 12, 20 respectively in rotation, as best seen in FIG. 3. FIG. 3 shows a multiple chamber integrated process system 40 comprising an enclosed, generally pentagonal main frame or housing 42 having five sidewalls 44 that define an enclosure, which may be a vacuum load lock enclosure, for the dual independent robot system 10. There are four vacuum processing chambers 46, 47, 48, 49 connected to four of the sidewalls 44. The process chambers 46, 47, 48, 49 and the associated sidewalls 44 have communication slots or slits 50 similar to the chamber opening 36 of FIGS. 1 and 2. Doors or slit valves 54 are provided for sealing the access slits 50. An external cassette chamber 56 is coupled to the remaining sidewall 44 for supplying wafers to the main housing 42. The main housing 42 typically also includes an internal cassette storage assembly which is not shown for simplicity.

The robot system 10 transfers wafers or substrates between the external cassette chamber 56 and the individual process chambers 46, 47, 48, 49. Because the two robot blades 18, 26 are independent in rotation and translation, they may transfer the wafers 28, 32 at different chambers or at the same chamber. Details of individual structural components and sensors and of the operations of the multiple chamber integrated process system 40 are known in the art, such as U.S. Pat. Nos. 5,292,393 and 5,452,521 identified above, and will not be repeated here.

As discussed above, the use of the dual independent robot blade system 10 will increase the throughput by a factor of up to two over a single robot blade system. This factor is higher for systems that require quick and frequent movements of the robot blades 18, 26 with short stays at any one chamber (robot over-tasking) over those with infrequent movements and longer stays (robot under-tasking). Another advantage of the dual independent robot blade system 10 is that the system 10 is still operational if one of the two blades 18, 26 breaks down.

Implementation of the Wafer Handling System

As discussed above, different robot arms have been used in wafer or substrate handling systems. The following discusses examples of robot arms that may be used to implement the dual independent robot system 10, which are provided merely for illustrative purposes.

Frog-Leg Robot Arm Mechanism

Figure 4:
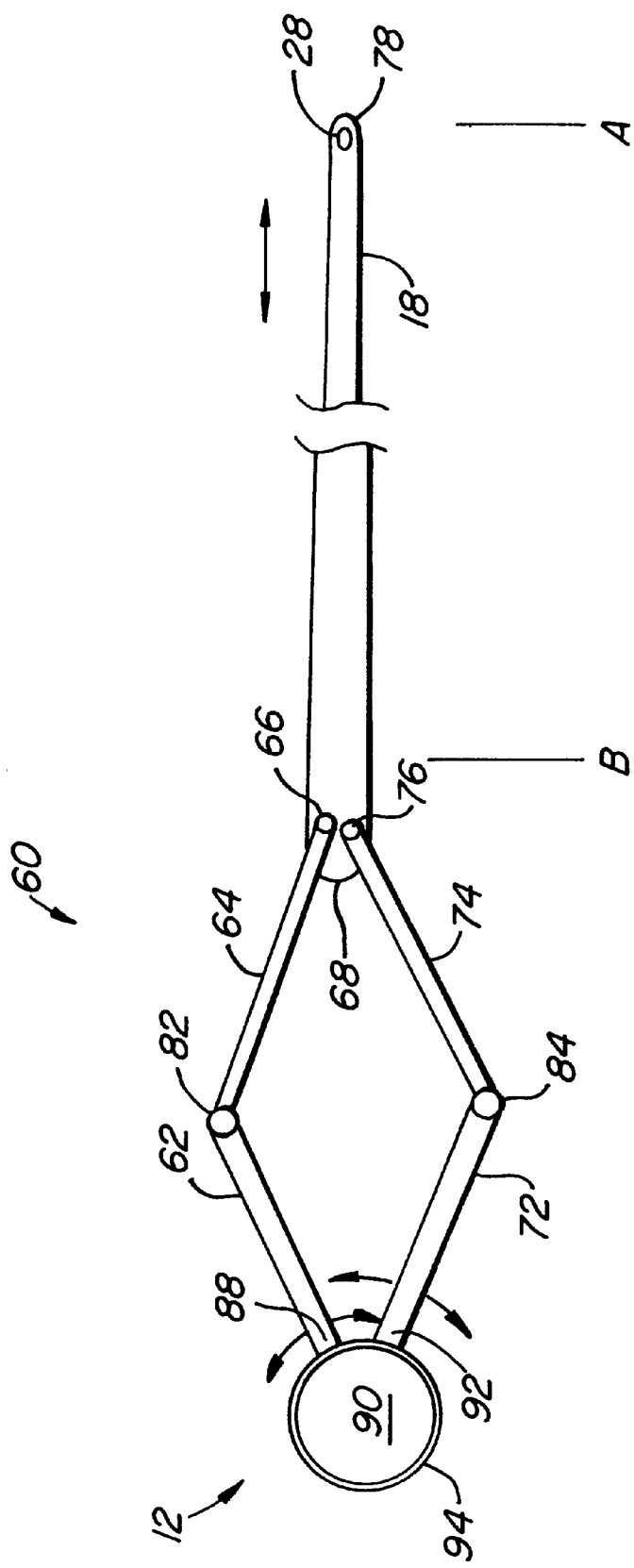
FIG. 4 is a top plan view of a frog-leg robot arm mechanism for operating the dual independent robot blades of FIG. 1.

In FIG. 4, a frog-leg robot arm mechanism 60 is used to support and operate the upper robot blade 18 to move the first wafer 28. A similar frog-leg mechanism can be used for moving the second wafer 32. The frog-leg robot arm mechanism 60 comprises a first distal link or main arm 62 rotatably coupled at its end to a first proximal link or forearm 64, which is rotatably coupled at its end to a first rotational joint 66 at the distal end 68 of the robot blade 18. The frog-leg robot arm mechanism 60 further comprises a second distal link or main arm 72 rotatably coupled at its end to a second proximal link or forearm 74, which is rotatably coupled at its end to a second rotational joint 76 at the distal end 68 of the robot blade 18. The first and second rotational joints 66, 76 are typically provided with bearings. A proximal end 78 (at position A) of the robot blade 18 supports the wafer 28 near the blade tip. At the rotational coupling between the first distal link 62 and first proximal link 64 is typically a first bearing 82 or similar structure. Similarly, a second bearing 84 is disposed at the rotational coupling between the second distal link 72 and the second proximal link 74. The frog-leg robot arm mechanism 60 is also illustrated in FIGS. 1 and 3.

The first distal link 62 has a first distal end 88 that is coupled to a first drive shaft 90. The second distal link 72 has a second distal end 92 that is coupled to a second drive shaft 94. The upper robot 12 operates the first and second drive shafts 90, 94. FIG. 4 shows the concentric drive shafts 90, 94 that are vertically offset from one another. Other configurations such as non-concentric drive shafts 90, 94 are possible. When the robot 12 drives the drive shafts 90, 94 in opposite rotational directions, the distal links 62, 72 and proximal links 64, 74 move in a frog-leg manner with extending and retracted folding movements. The resultant motion of the robot blade 18 is extension into and retraction out of the process chamber. When the robot 12 drives the drive shafts 90, 94 in the same rotational direction, the distal links 62, 72 and proximal links 64, 74 do not move in a frog-leg manner. Rather, the distal links 62, 72 and proximal links 64, 74 rotate together around the drive shafts 90, 94 of the robot 12 from one chamber to the next. The robot 12 includes motors, gears, and other components that are known in the art and will not be discussed here.

The robot arm mechanism 60 and the robot blade 18 must be sufficiently long to move the wafer 28 through the chamber opening 36 into the process chamber or other chambers to load or unload the wafer 28. In one embodiment, the robot blade 18 is desirably made sufficiently long to facilitate the required movement. Such a long robot blade 18 typically ranges from about 200 to 300 mm. As discussed above, the maximum thickness of the robot blade 18 is desirably equal to or less than about 6 mm.

Alternatively, the blade 18 is made shorter (under 200 mm), and the first and second proximal links 64, 74 and the first and second rotational joints 66, 76 may extend into the chamber opening 36 with the short blade 18. The first and second bearings 82, 84, along with portions of the first and second distal links 62, 72, may also extend into the chamber opening 36. In that case, the maximum height of the proximal links 64, 74, the bearings at the first and second rotational joints 66, 76, the distal links 62, 72, and the first and second bearings 82, 84 is desirably equal to or less than 6 mm. The use of a long blade 18 allows one to use thicker links and bearings, but is more susceptible to bending and vibration. The use of a short blade 18 alleviates these problems, but requires thinner links and bearings. As discussed above, a similar frog-leg robot arm mechanism as the mechanism 60 can be used to operate the lower robot blade 26, such as shown in FIG. 1.

Four-Bar Link Robot Arm Mechanism

Figure 5:
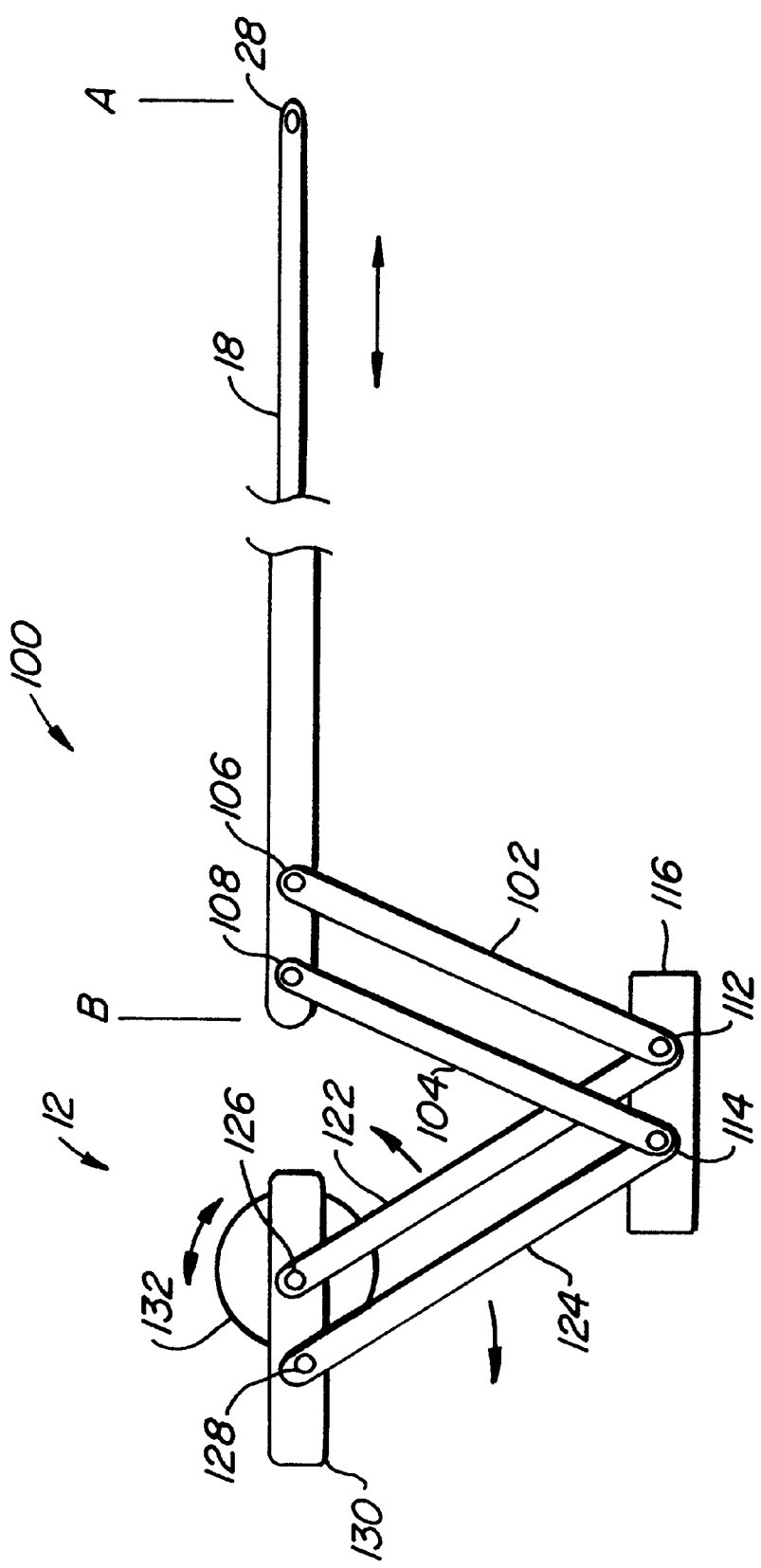
FIG. 5 is a top plan view of a four-bar link robot arm mechanism for operating the dual independent robot blades of FIG. 1.

In the four-bar link robot arm mechanism 100 of FIG. 5, first and second parallel links 102, 104 have ends that are pivotally mounted, respectively, at first and second spaced rotational joints 106, 108 of the upper robot blade 18. The other ends of the parallel links 102, 104 are mounted, respectively, at spaced pivot points 112, 114 along a connecting link 116. The first and second parallel links 102, 104, robot blade 18, and connecting link 116 form a parallelogram. The four-bar link mechanism 100 further comprises third and fourth parallel links 122, 124 having ends that are pivotally coupled, respectively, to first and second spaced drive shafts 126, 128, which are coupled to a bracket 130 of the upper robot 12. The other ends of the third and fourth parallel links 122, 124 are also mounted, respectively, at the spaced pivot points 112, 114 of the connecting link 116 coupled with the ends of the first and second parallel links 102, 104. The pivot points 112, 114 typically include bearings. The third and fourth parallel links 122, 124, the bracket 130 between the first and second drive shafts 126, 128, and the connecting link 116 form another parallelogram.

The drive shafts 126, 128 are driven by the robot 12 in rotation. Rotation of the drive shafts 126, 128 in the same direction effects a translational extension and retraction of the robot blade 118. Because of the connection points at the first and second spaced rotational joints 106, 108 of the robot blade 18, at the first and second drive shafts 126, 128 of the upper robot 12, and commonly at the spaced pivot points 112, 114 of the connecting link 116, the two parallelogram configurations are maintained during rotation of the four-bar link mechanism 100. The translation movement of the blade 18 is parallel to a line through the drive shafts 126, 128 of the robot 12 and a line through the first and second spaced rotational joints 106, 108 of the robot blade 18.

The bracket 130 may be rotated to rotate the fourbar link mechanism with respect to the robot 12. To effect such a rotation, a rotation drive shaft 132 is coupled to the bracket 130 to drive the bracket 130 in rotation. In the embodiment of FIG. 5, this rotation drive shaft 132 is commonly aligned with the first drive shaft 126, but need not be aligned in other embodiments. The rotation drive shaft 132 is desirably a hollow shaft in which the first drive shaft 126 is disposed and rotates. Other configurations are possible. In addition, other four-bar link configurations may be used. The size and shape of the robot blades 18, 26 have been discussed above.

As discussed above, a second four-bar link robot arm mechanism similar to the four-bar link mechanism 100 of FIG. 5 may be used to control the movement of the lower robot blade 26 and wafer 32. The second mechanism may be identical to the four-bar link mechanism 100 of FIG. 5, or may be a mirror image thereof.

A range of metallic and nonmetallic materials can be used for the robot blades 18, 26 as well as the links in the frog-leg and four-bar link robot arm mechanisms 60, 100. The material is desirably light weight and strong to minimize deflection and vibration. The choice of the material, as well as the dimensions, becomes more important if long blades 18, 26 are used, since deflection and vibration are more problematic than for short blades. In addition to the tapering of the blades 18, 26 as shown in FIG. 2, the material is selected for strength and light weight, such as sapphire. In one example, the use of sapphire and the hollow and tapered structure with the dimensions of FIG. 2 produces a blade having a weight of about 0.236 kg. The use of sapphire in long blades 18, 26 of 200–300 mm in length has reduced the bending to under about 0.5 mm maximum deflection. Other metals, composites, and ceramics may be used as well depending on the various dimensions of the blades 18, 26. The key criterion is to provide a clean, non-contaminated structure optimized for strength-to-weight ratio for the robot blades 18, 26. The optimization is a function, among others, of the length of the blades 18, 26 and the size of the gap 30 between the blades 18, 26.

The above-described arrangements of apparatus and methods are merely illustrative of applications of the principles of this invention and many other embodiments and modifications may be made without departing from the spirit and scope of the invention as defined in the claims. For instance, other robot arm structures may be used, such as scissors and telescopic mechanism. In addition, both the upper and lower robot blades 18, 26 may have identical but opposing blades (not shown) that feed the chambers 180° opposed to each other. The advantage of this alternate embodiment is that the throughput can be further increased when using 4 identical chambers on a system, or when using 2 integrated chambers on such a system.

All patents, applications, and publications referred to above are incorporated herein by reference in their entirety.

What is claimed is:

1. A robot blade system for moving substrates into and out of a chamber through an opening, the robot blade system comprising:

a first robot blade for supporting a first substrate;

a second robot blade disposed generally above and spaced from the first robot blade by a small distance for supporting a second substrate;

a first robot arm coupled to the first robot blade for moving the first substrate and at least a portion of the first robot blade through the opening into the chamber and moving the first substrate and the first robot blade out of the chamber; and a second robot arm coupled to the second robot blade for moving the second substrate and at least a portion of the second robot blade through the opening into the chamber and moving the second substrate and the second robot blade out of the chamber, the second robot arm being independently movable from the first robot arm, wherein each robot arm comprises a connecting link, a bracket coupled between the first and second drive shafts spaced from one another, a first parallel link having a first end pivotally coupled to a first point on the first robot blade and a second end pivotally coupled to a first point on the connecting link, a second parallel link generally parallel to the first parallel link and having a first end pivotally coupled to a second point on the first robot blade spaced from the first point and a second end pivotally coupled to a second point on the connecting link spaced from the second point, a third parallel link having a first end pivotally coupled to the first drive shaft and a second end pivotally coupled to the first point on the connecting link, and a fourth parallel link generally parallel to the third parallel link and having a first end, pivotally coupled to the second drive shaft and a second end pivotally coupled to the second point on the connecting link.

2. The system of claim 1, wherein the bracket is rotatable relative to an axis which is generally parallel to the first and second drive shafts.

3. The system of claim 1 further comprising a wafer lift mechanism, wherein the distance is sufficiently small so as to permit the same wafer lift mechanism to lift and remove or replace substrates on both the first robot blade and the second robot blade without vertical indexing of the first or second robot blades.

4. The system of claim 3, wherein the distance is about 2.5 mm.

5. The system of claim 3, wherein the second robot blade has a hollow portion tapered to a blade tip portion which is thinner than the hollow portion.

6. The system of claim 3, wherein the second robot blade has a maximum thickness of about 6 mm.

7. The system of claim 3, wherein the second robot blade comprises a material having a strength-to-weight ratio that provides a bending deflection of the second robot blade of under about 0.5 mm.

8. The system of claim 7, wherein the material includes sapphire.

9. The system of claim 8, wherein the second robot blade has a length of at least about 200 mm.

10. A method for moving substrates into and out of a chamber through an opening, the method comprising:

supporting a first substrate on a first robot blade coupled to a first robot arm;

supporting a second substrate on a second robot blade coupled to a second robot arm and disposed generally above and spaced from the first robot blade by a distance, wherein each robot arm comprises a connecting link, a bracket coupled between the first and second drive shafts spaced from one another, a first parallel link having a first end pivotally coupled to a first point on the first robot blade and a second end pivotally coupled to a first point on the connecting link, a second parallel link generally parallel to the first parallel link and having a first end pivotally coupled to a second point on the first robot blade spaced from the first point and a second end pivotally coupled to a second point on the connecting link spaced from the second point, a third parallel link having a first end pivotally coupled to the first drive shaft and a second end pivotally coupled to the first point on the connecting link, and a fourth parallel link generally parallel to the third parallel link and having a first end pivotally coupled to the second drive shaft and a second end pivotally coupled to the second point on the connecting link;

moving the first substrate and at least a portion of the first robot blade through the opening into the chamber;

removing the first substrate from the first robot blade using a wafer lift mechanism;

moving the first robot blade out of the chamber;

returning the first robot blade through the opening into the chamber;

placing the first substrate on the first robot blade using the wafer lift mechanism;

moving the first substrate arid the first robot blade out of the chamber;

moving the second substrate and at least a portion of the second robot blade through the opening into the chamber; and removing the second substrate from the second robot blade using the wafer lift mechanism.

11. The method of claim 10 wherein the distance is sufficiently small so as to permit the same wafer lift mechanism to lift and remove or replace substrates on both the first robot blade and the second robot blade without vertical indexing of the first and second robot blades.

* * * * *